United States Patent [19]

Cross et al.

[11] 4,109,359
[45] Aug. 29, 1978

[54] METHOD OF MAKING FERROELECTRIC CRYSTALS HAVING TAILORED DOMAIN PATTERNS

[75] Inventors: Leslie E. Cross; Robert E. Newnham, both of State College, Pa.

[73] Assignee: The United States of America as represented by the Secretary of the Navy, Washington, D.C.

[21] Appl. No.: 693,808

[22] Filed: Jun. 7, 1976

[51] Int. Cl.² .............................................. H01L 41/22
[52] U.S. Cl. .................................... 29/25.35; 310/359; 310/360
[58] Field of Search ............... 29/25.35; 310/357–360; 340/173.2; 350/150; 423/263

[56] References Cited

U.S. PATENT DOCUMENTS

| | | | |
|---|---|---|---|
| 3,773,898 | 11/1973 | Aizu et al. | 423/263 |
| 3,799,648 | 3/1974 | Flippen | 350/150 |
| 3,851,192 | 11/1974 | Flippen et al. | 350/150 X |
| 3,921,154 | 11/1975 | Barkley | 340/173.2 X |
| 3,936,146 | 2/1976 | Kumada et al. | 340/173.2 X |

*Primary Examiner*—Carl E. Hall
*Attorney, Agent, or Firm*—R. S. Sciascia; L. I. Shrago

[57] ABSTRACT

Ferroelectric crystals and ceramics prepared with tailored domain patterns which are selected to enhance or suppress certain modes of vibration which may include those normally unattainable such as, for example, second harmonics.

1 Claim, 11 Drawing Figures n = 0, m = 0 n = 1, m = 1 n = 1, m = 2

METHOD OF MAKING FERROELECTRIC CRYSTALS HAVING TAILORED DOMAIN PATTERNS

The present invention relates generally to apparatus for and methods of controlling the elastic mode of vibration of piezoelectric elements and, more particularly, to ferroic piezoelectric crystals or ceramics having tailored domain patterns that are selected so as to enhance or suppress certain modes of vibration.

Piezoelectric crystals are utilized in a wide variety of electronic applications as the frequency control or stabilizing means. Each crystal, as is well known, has a number of resonant frequencies that depend on its dimension, the orientation of the crystal plate with respect to the various crystal axes and the type of mechanical motion involved. The most important vibration modes are longitudinal, flexural, face-shear and thickness-shear. Each of these different kinds of vibration may exist in a fundamental and higher order of harmonic modes. However, these modes are often mechanically intercoupled, and this interaction gives rise to additional combinational modes.

Undesirable modes can be partially eliminated by, for example, orienting and proportioning the crystal element so that the resonant frequencies of these interfering modes differ appreciably from that of the desired mode. Suppression can also be accomplished to some extent by contouring the vibrating element or by mounting it in such a way that the undesired modes are restrained by a clamping action. Recently, modern evaporation and photo-etching techniques have been used to produce complex electrode patterns which favor a particular resonance.

It is also possible to suppress some of the spurious vibrating modes by a partial electroding process. However, since much of the crystal is not electrically coupled when the electrodes cover only part of its surface, this approach is not entirely satisfactory since it attenuates the amplitude of the desired vibrating mode. The same reduction is also experienced when the crystal plate is contoured or clamped at different sites.

Twinning in piezoelectric crystals is normally undesirable since this structural condition usually detracts from the efficiency of the electromechanical energy conversion process. The reason for this is that natural and fortuitous conditions are responsible for the occurrence and disposition of these domains. Thus, when these domains form, their characteristics cannot be expected to be in harmony with the desired vibrational modes. For example, if the piezoelectric coefficient in one domain is orientated in a given direction, there is the probability that in an adjacent domain, this coefficient may not be aligned. If it is in a conflicting direction, the net effect may be a piezoelectric element having little or no piezoelectric response.

It is, accordingly, a primary object of the present invention to provide piezoelectric elements having tailored domain patterns corresponding to certain specified modes of vibration.

Another object of the present invention is to provide ferroic piezoelectric crystals or ceramics with multi-domain patterns that are established to enhance or suppress certain vibrational modes.

Another object of the present invention is to provide a method for selectively modifying the internal properties of piezoelectric crystals so as to create domain patterns therein that favor preselected mechanical motions.

Another object of the present invention is to control the electromechanical energy response of piezoelectric vibrating elements by forming certain domain conditions within these elements.

Another object of the present invention is to provide a method for fabricating multi-domain ferroic piezoelectric crystals wherein the characteristics of the domains are manipulated by appropriate driving forces so as to enhance or suppress different vibration modes.

Briefly, and in somewhat general terms, the above objects of invention are achieved by taking advantage of the fact that numerous piezoelectric crystals are ferroic. The term ferroic as used in this disclosure applies to all types of mimetically twinned crystals in which the orientation of one or more of the twin components may be effected by the application of suitably chosen external driving forces. Ferroics may be broadly classified in accordance with the particular property tensor that distinguishes one orientation state from another in the material. It is these property tensors which determine the nature and orientation of the driving fields which are required to accomplish reorientation between these states or to shift the boundary walls between these states.

The so-called primary ferroics are those in which the domain or twin states are distinct in the orientation of the lowest rank response tensor, that is, for example, electric polarization, elastic strain or magnetization. There are also primary ferroic species wherein more than one type of response may occur. For example, in ferroic electric species derived from non-centric prototypic structures, the twin states or domains are frequently distinct in both the orientation of spontaneous electric polarization and of spontaneous elastic strain. Consequently, these structures may be driven between states either by electric fields or elastic stresses.

There are many crystals with mimetically twinned systems in which the different twin components do not differ in the orientation of the above primary properties. However, some of these crystals may be driven by the differences in the orientation of higher rank tensors. For example, if the twinning rules which govern the establishment and characteristics of the domain specify that different orientations of the elastic compliance tensor must prevail, a suitable orientated stress can produce different strains in the two domains. This stress may act upon the difference in induced strain to produce wall motion and domain reorientation. AIZU has suggested the term ferrobielastic to identify this type of behavior and he has illustrated this effect with Dauphine' twinning in quartz.

Perhaps the simplest way to describe ferroic phenomena is to apply the Landau, Ginsberg, Devonshire thermodynamic formalism to determine the free energy differences $\Delta G$ induced by applying an electric field, an elastic stress and a magnetic field to two of the domain states of a mimetically twinned crystal. It is known from the simple primary systems that the spontaneous strains from some common prototype structure must be small, ($E \simeq 10^{-3}$), for domain switching to occur. Hence, the simpler form of the infinitesimal strain theory may be used without serious error.

The energy function then takes the form for domain ('):

$$\Delta G = -P'_{(s)i}E_i - \epsilon'_{(s)ij}\sigma_{ij} - M'_{(s)i}H_i - \kappa'_{ij}E_iE_j - s'_{ijkl}\sigma_{ij}\sigma_{kl} - \chi'_{ij}H_iH_j - d'_{ijk}E_i\sigma_{jk} - \pi'_{ijk}H_i\pi_{jk} - \chi'_{ij}E_iH_j \quad (1)$$

and for domain ("):

$$\Delta G = -P''_{(s)i}E_i - \epsilon''_{(s)ij}\sigma_{ij} - M''_{(s)i}H_i - \kappa''_{ij}E_iE_j - s''_{ijkl}\sigma_{ij}\sigma_{kl} - \chi''_{ij}H_iH_j - d''_{ijk}E_i\sigma_{jk} - \sigma''_{ijk}H_i\sigma_{jk} - \chi''_{ij}E_iH_j \quad (2)$$

The primed constants are related to the double primed constants by appropriate symmetry transformations. P is polarization; E, electric field; $\epsilon$, strain; $\sigma$, stress; M, magnetization; H, magnetic field; $s$, elastic compliance, $\kappa$, dielectric permittivity; $x$, magnetic susceptibility; $d$, piezoelectric coefficient; $\pi$, piezomagnetic coefficient; $\chi$, magnetoelectric coefficients; and subscript $(s)$ denotes a spontaneous effect. Directional subscripts refer to cortesian coordinates with $i, j, k = 1, 2, 3$.

In the case of the lowest rank terms, if $$P''_{(s)i}E_i - P'_{(s)i}E_i \quad (3)$$

$$M''_{(s)i}H_i - M'_{(s)i}H_i \quad (4)$$

$$\epsilon''_{(s)ij}\sigma_{ij} - \epsilon'_{(s)ij}\sigma_{ij} \quad (5)$$

are non-zero, and the displacements required to get from orientation (') and (") are small, the free energy of the two domains may be changed differently by a suitably chosen electric field, magnetic field or elastic stress. Thus, ferroelectric, ferromagnetic and ferroelastic switching may result.

Since non-zero values of (3), (4) and (5) are not mutually exclusive, twins may be simultaneously ferroelectric, ferromagnetic and ferroelastic.

If the lowest rank terms are zero, an energy difference may still be generated through the terms $$\kappa''_{ij}E_iE_j - \kappa'_{ij}E_iE_j \quad (6)$$

$$\chi''_{ij}H_iH_j - \chi'_{ij}H_iH_j \quad (7)$$

$$s''_{ijkl}\sigma_{ij}\sigma_{kl} - s'_{ijkl}\sigma_{ij}\sigma_{kl} \quad (8)$$

The energy difference is now quadratic in the electric field, magnetic field and elastic stress, and ferrobielectric, ferrobimagnetic and ferrobielastic switching of the domains may result.

Those types of twin structures which exhibit only non-zero cross terms of the form $$d''_{ijk}E_i\sigma_{jk} - d'_{ijk}E_i\sigma_{jk} \quad (9)$$

$$a''_{ij}E_iH_j - a'_{ij}E_iH_j \quad (10)$$

$$\pi''_{ijk}H_i\sigma_{jk} - \pi'_{ijk}H_i\sigma_{jk} \quad (11)$$

have been designated ferroelastoelectric, ferromagnetoelectric and ferromagnetoelastic. Taking for example a system in which the twin domains differ in the orientation of the piezoelectric tensor $d_{ijk}$, to effect a difference in energy between the domains, both an electric field, $E_i$, and an elastic stress $\sigma_{jk}$, must be applied at the same time. Either acting alone will leave the energy changes identical. Thus, the ferroelastoelectric element is neither ferroelectric nor ferroelastic.

The following table lists some of the well known primary ferroics and some secondary ferroic crystals identifying the difference between domain states and the driving fields required to switch or displace these states:

TABLE 1

Primary and Secondary Ferroics [5]

| Ferroic Class | Orientation States Differ in | Switching Force | Example |
|---|---|---|---|
| Primary | | | |
| Ferroelectric | Spontaneous Polarization | Electric Field | $BaTiO_3$ |
| Ferroelastic | Spontaneous Strain | Mechanical Stress | $\beta\text{-}Au_xCu_{1-x}Zn$ |
| Ferromagnetic | Spontaneous Magnetization | Magnetic Field | $Fe_3O_4$ |
| Secondary | | | |
| Ferroelectric | Dielectric Susceptibility | Electric Field | $SrTiO_3(?)$ |
| Ferrobimagnetic | Magnetic Susceptibility | Magnetic Field | NiO |
| Ferrobielastic | Elastic Compliance | Mechanical Stress | $SiO_2$ |
| Ferroelastoelectric | Piezoelectric Coefficients | Electric Field & Mechanical Stress | $NH_4Cl$ |
| Ferromagnetoelastic | Piezomagnetic Coefficients | Magnetic Field & Mechanical Stress | $CoF_2$ |
| Ferromagnetoelectric | Magnetoelectric Coefficients | Magnetic Field & Electric Field | $Cr_2O_3$ |

For a further discussion of primary and secondary ferroics, reference may be had to the articles entitled, "Symmetry of Secondary Ferroics. I." and "Symmetry of Secondary Ferroics. II." by R. E. Newnham and L. E. Cross, which appeared in Vol. 9, pp. 927 - 934 and 1021 - 1032, Material Research Bulletin, 1974, published by Pergamon Press, Inc. These publications also identify examples of materials in each of the various categories listed.

Other objects, advantages and novel features of the invention will become apparent from the following detailed description of the invention when considered in conjunction with the accomanying drawings wherein:

FIG. 1(a), FIG. 1(b), and FIG. 1(c) are a series of illustrations helpful in explaining the operating principle of the present invention;

Figure 1A:
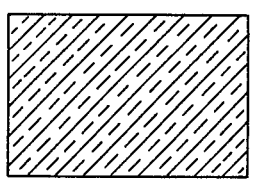
Figure 1B:
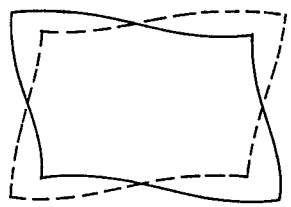
Figure 1C:
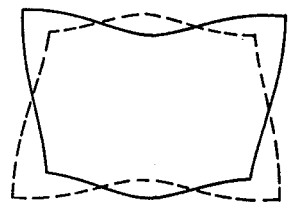

The manner in which the tailored domain concept of the present invention may be employed to selectively excite certain normally forbidden harmonic modes may perhaps best be appreciated by considering the sequence of illustrations in FIG. 1 which depict the motion of a plate in a low frequency face-shear mode. In FIG. 1(a), the plate, which may be a CT or a DT rectangular quartz element of the kind normally used as an electromechanical vibrating element of a filter or oscillator, is at rest. FIG. 1(b) shows the fundamental face-shear mode which consists of expansion and compression in opposite phase along the two diagonals of the plate. This shear motion may break up into higher frequency modes similar to the fundamental. FIG. 1(c) shows a harmonic wherein two equal segments of the plate are vibrating in opposite phase. To generate other harmonics, the motion is reversed in phase a number of times along either the length or width of the plate.

To excite the face-shear fundamental shown in FIG. 1(b), the major faces of the plate are electroded, and an external electrical field is applied normally to the plate. If $X_1$ is the direction normal to the plate then $E_1$ designates the field in this direction. If $X_2$ and $X_3$ are the directions parallel to the length and width of the plate then $\epsilon_{23}$ is a shear strain about $X_1$. The face-shear fundamental consists of alternating strains of $\pm\epsilon_{23} = d_{123}E_1$, where $d_{123}$, the piezoelectric coefficient, is a third rank tensor. When the frequency of the applied field $E_1$ corresponds to the natural resonant frequency of the plate as determined by its dimensions and elastic constants, resonance occurs.

The harmonic condition shown in FIG. 1(c) cannot be excited when the plate is fully electroded. This is seen from the fact that the two halves of the plate must be out-of-phase, and there is no way to achieve this relationship with an external electric field acting uniformly over the complete surface of the crystal. To excite this harmonic, partial electrodes could be used. But, this technique, as noted, impairs the electromechanical energy conversion process and results in a condition of reduced vibration.

The harmonic shown in FIG. 1(c) can, however, be generated by employing a twinned piezoelectric crystal. Such a crystal need only have a simple electrode pattern covering both domains. With such an arrangement, there is less field distortion and superior electromechanic energy conversion. This may be seen from considering FIG. 2(a) which represents a crystal plate twinned through its center. One domain is generally represented by reference character 10, the other by 11. Each twin occupies one half of the element. The material is selected such that the two relevant piezoelectric coefficients are anti-parallel. Under a uniform alternating field $E_1$, as applied in FIG. 3, the crystal vibrates in pattern shown in FIG. 2(b) because the piezoelectric coefficient $d_{123}$ is of opposite sign in the two twins, thereby inducing opposite shears. Since this mode of vibration is realized by internal modifications to the crystal structure rather than by external factors, none of the undesirable effects mentioned hereinbefore which accompany previous methods are encountered.

The twins in this particular example are of the simple type in which the orientations are related by reflection across the crystal plane (100). Ammonium chloride has such reflection domains. At low temperatures $NH_4Cl$ is a piezoelectric ferroelastoelectric with high symmetry and very few independent property coefficients. While it is perhaps a comparatively inappropriate material because of its solubility and softness, nevertheless, for purposes of this explanation, it does serve as a good example of a ferroelastoelectric solid. Its piezoelectric coefficient $d_{123}$ at low temperature has been increased from zero to a maximum value of $3 \times 10^{-12}$ m/V by changes made to its domain structure. These domain changes were induced by a uniaxial stress and a DC electric field applied simultaneously along the [111] direction as the crystal was cooled through the order-disorder transition.

At low temperatures, $NH_4Cl$ has two orientation states, and the crystal will be twinned if the domains nucleate at random. The cubic symmetry of this crystal imparts the following properties to the two orientation states. First it precludes pyroelectricity and other first rank tensor properties. Second rank tensors, such as permittivity are isotropic in the cubic system and, therefore, identical in the two orientation states. Third rank tensor coefficients are zero for the centric class m3m but not for the acentric class 43m which has one independent piezoelectric coefficient, $d_{123}$, relating electric polarization along $X_1$ to mechanical shearing stress about the same axis. The piezoelectric effect is different in the two orientation states since $d_{123}$ changes sign under reflection across plane (100). A shearing stress about $X_1$ produces polarization of opposite signs in the two domains.

In cubic crystals, the property axes, $X_1$, $X_2$ and $X_3$ are coincident with the crystal graphic directions [100], [010], and [001], respectively. Reflection across (100) transforms $X_1$ to $-X_1$ while leaving $X_2$ and $X_3$ unchanged. Consequently, any polar tensor coefficient having an odd number of 1's in the subscript will be reversed in sign for the two domains.

Figure 2A:
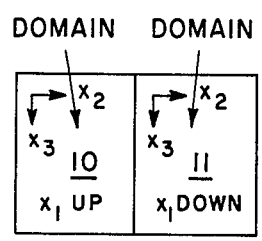
FIG. 2(a) illustrates a twin piezoelectric crystal with a vertical domain wall dividing the crystal in half.

The properties of the domain states in low temperature ammonium chloride are identical for polar tensors of rank 1, 2 and 4 but not for rank 3. Thus, dielectric and elastic properties are unaffected by domain walls, but the piezoelectric coefficient changes sign. The domain walls in this material can be moved by combined electric and mechanical forces. In this regard, an appropriate electric field along a cube edge must be applied simultaneously with a shearing stress about the edge to produce wall motion. This ferroelastoelectric switching capability makes it possible to control the material's domain configurations. If the domain structure shown in FIG. 2(a) is built into an appropriate ferroelastoelectric substance and the plate electroded on its major faces perpendicular to $X_1$, an alternating field $E_1$ applied thereto will generate the harmonic mode shown in FIG. 2(b). This behavior is a consequence of the differences in the piezoelectric coefficients in these domains. Furthermore, no scattering of electric elastic waves will occur at the domain wall because the strain and elastic constants which are second rank and fourth rank tensors, respectively, are continuous across the domain wall.

Figure 2B:
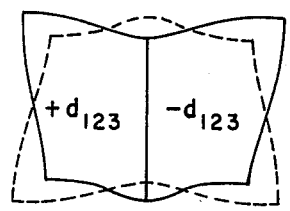
FIG. 2(b) depicts the vibrating pattern of this crystal under a uniform alternating electric field with two phases shown.
Figure 3:
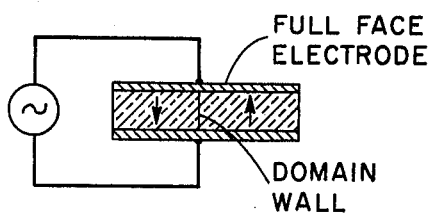
FIG. 3 shows how the crystal structure of FIG. 2 may be excited.

Comparing now FIG. 2(b) with FIG. 1(c), it will be seen that what may be considered the fundamental vibration of the twinned crystal corresponds to a harmonic of an untwinned crystal.

The vibration patterns corresponding to the various harmonics and combination modes are well known. Thus, it is only necessary to make the domain patterns correspond to one of these vibration patterns to achieve a selective excitation result. In this way, any harmonic can be excited even those normally classified as forbidden harmonics. Since the present invention, in effect, converts any harmonic to a fundamental, it may be adopted to obtain a more efficient electromechanical energy conversion and a greater vibration amplitude at a desired frequency.

Quartz, which is one of the most important piezoelectric materials, is ferrobielastic and potentially ferroelastoelectric. As is well known, several types of twinning occur in quartz, such as optical or Brazil twins and electric or Dauphine twins. The optical twins are essentially growth twins involving handedness arrangement of silicon oxygen tetrahedra in the structure. To convert right-handed quartz to left-handed quartz, strong silicon oxygen bonds must be broken and the twinning is not ferroic.

Electric twinning involves much more subtle distortions of the structure, associated with the loss of symmetry which occurs at the $\beta \rightarrow \alpha$ transition corresponding to the change from point groups 622 to 32. These symmetries are consistent with ferroic species 622F32, which is both ferrobielastic and potentially ferroelastoelectric.

Stress induced twinning and detwinning of the electric twins in quartz has been known. Both temperature gradients and torsional stresses have been used to modify the electric twin structures to produce quartz cuts in transducer applications. Recently, AIZU demonstrated control twin motion in quartz by using uniaxial stress applied normal to direction [100] and at 45° to [001]. When viewed along [100] in polarized light, the domains were visible because of the differences in the photoelastic coefficients.

The mechanical stress techniques utilized heretofore to modify domains in quartz is cumbersome and not completely reliable. According to one aspect of the present invention, the desired domain patterns are created optically using lasers or other high intensity collimated light beams. With these energy sources, large thermal stresses can be induced by localized heating since the surrounding cooler regions of the material tend to restrain thermal expansion. Under these conditions, the stresses are the same as if the heated region were allowed to expand freely and then compress back to the original size by an applied restraining force. The stress so created is proportional to the stiffness of the material and the elastic strain, which is equal to the product of the thermal expansion and temperature difference.

For an elastic rod restrained in only one direction, the thermal stress is simply $c\ \alpha(\Delta T)$, where $c$ is the elastic stiffness, $\alpha$, the thermal expansion coefficient and $(\Delta T)$, the temperature difference between the hot and cold ends. In the case of quartz, the stiffness coefficients depend on direction, but $c$ is about $10^{11} N/m^2$ and $\alpha$ is about $10^{-5}/°$ C. Mechanical stresses of about $5 \times 10^8 N/m^2$ are required to move Dauphine' twin walls at room temperature.

Temperature differences of 500° are, therefore, necessary to drive the walls by thermal action. However, the coercive stress is considerably smaller at higher temperatures At 500° C, stresses of $10^7 N/m^2$, and the temperature differences of 10° C are sufficient to move domain walls.

Figure 4:
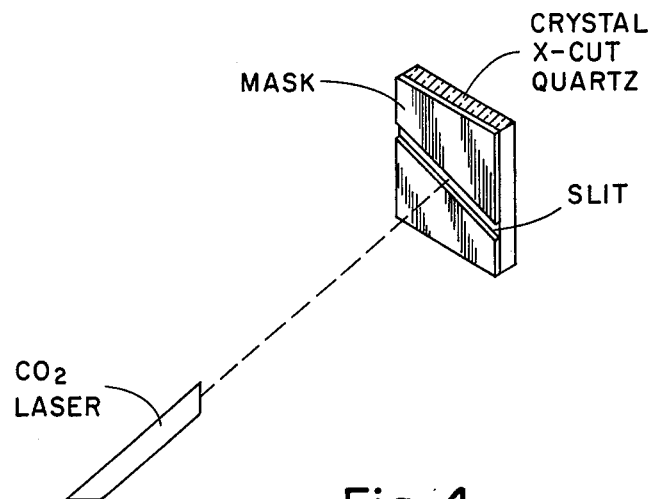
FIG. 4 shows an arrangement utilizing a laser for forming domain patterns in ferroic crystals.

Quartz has several absorption bands near 10 $\mu$m. Consequently, a $CO_2$ laser can be utilized as the irradiating means for optically forming the domains. In one case, as illustrated in FIG. 4, X and AT cut untwinned quartz crystals were exposed to a pulsed $CO_2$ laser through a mask which took the form of a graphite layer applied to the exposed surface of the plate. A 0.015 cm slit was machined in the graphite to obtain the appropriate stress configuration. The orientation of this slit was carefully controlled with respect to the crystal axis.

In order to lower the coercive stresses, the apparatus was placed in a small oven and heated to approximately 500° C. It was then irradiated and allowed to cool gradually to room temperature. After etching in hydrofluoric acid, the crystals were examined for twinning using reflected light. Since the etch pits in the untwinned portion of the platelet differ from those of the twinned area, light is reflected preferentially and is angular dependent.

The piezoelectric coefficients differ in neighboring Dauphine' twins so that the piezoelectric resonators of the type previously mentioned can be constructed from multi-domain specimens formed in accordance with the above technique. Since twin domains in quartz do not possess quite identical elastic properties, acoustic waves may be scattered to some extent at the domain walls. The elastic stiffness coefficient $c_{1123}$ differs in sign from the two orientation states. However, elastic waves which do not involve this coefficient will not be scattered.

Other piezoelectric materials which are suitable for tailored domain configurations are gadolinium molybdate, lithium niobate and lead germanate. The nature of the driving force required to displace the domain walls in these materials depends upon the ferroic species. Reference may be made again to Table 1 for the appropriateness of electric fields and mechanical stresses for this purpose. Complex domain patterns can be generated in the ferroelectric lead germanate by following another method of this invention. $Pb_5Ge_3O_{11}$ belongs to the ferroic species 6F3. Below 171° C, the crystal is ferroelectric with a spontaneous polarization of about 4 $\mu C/cm^2$. Reversing the polarization reverses the sign of certain piezoelectric coefficients. Of the six independent coefficients, four change sign and two do not.

Domains in $Pb_5Ge_3O_{11}$ are of the 180° type with the spontaneous polarization directed along $\pm c$. Piezoelectric coefficients $d_{111}$ and $d_{222}$ are identical in the two domains, but $d_{231}$, $d_{232}$ and $d_{311}$ and $d_{333}$ change sign for up and down domains. Of the six coefficients, only $d_{311}$ and $d_{333}$ have appreciable magnitude with the other four being nearer zero. Use may be made of $d_{311}$ and $d_{333}$ in designing domain patterns in piezoelectric oscillator plates. The elastic properties of the 180° domains are identical so that little scattering of acoustic waves occurs at the domain boundaries.

Very high harmonics can be generated when the piezoelectric element has closely spaced domains. In $Gd_2(MoO_4)_3$, the domain walls are parallel to the (110) and (1$\bar{1}$0) planes and regularly spaced at intervals as small as 10 $\mu$m. With electrodes applied to the (001) face, mechanical vibrations can be excited by an electric field along the [001] direction through piezoelectric coefficients $d_{312}$ and $d_{333}$. Alternate domains differ in the sign of $d_{36}$ causing opposite shear at about [001].

Figure 5:
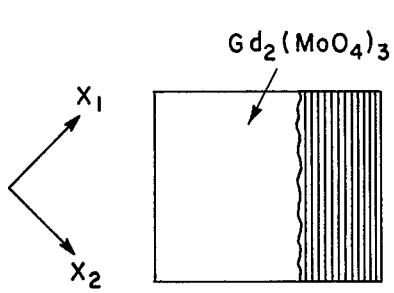
FIG. 5 shows a $Gd_2(MoO_4)_3$ with microscopic domains parallel to plane (110)
Figure 6:
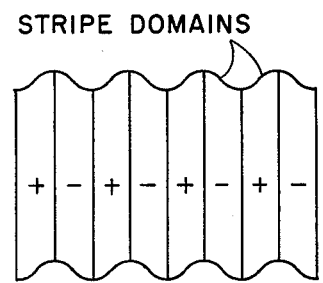
FIG. 6 illustrates a portion of the structure of FIG. 5 vibrating in a face-shear mode.

In this material, the domains correspond to half the resonance wavelength. Macroscopic domains parallel to (110) are depicted in FIG. 5. FIG. 6 illustrates the resonance face-shear mode attainable with this composition. Typical acoustic velocities for this material are $10^5$ cm/sec with a wavelength of 20 $\mu$m, and this gives a resonant frequency of $10^8$ Hz. Acoustic waves are not scattered at domain walls because the [110] direction corresponds to one of the original tetragonal axis in hightemperature gadolinium molybdate. The elastic constants are identical for this direction in the room temperature orthorhombic phase.

Striped domains can be created in this material either by elastic or electrical forces. The repulsive forces between the domain walls are responsible for the equal spacings. These regularly spaced domain patterns have application in high frequency filters and optical gratings.

Figure 7:
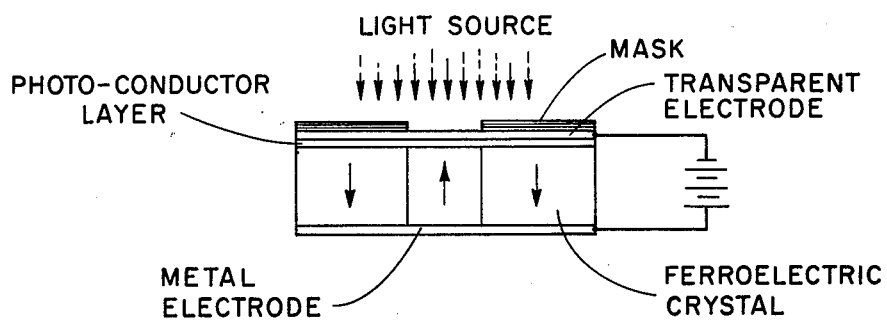
FIG. 7 is the resonant frequency spectra of a gadolinium molybdate crystal having a single domain and a pair of domains.

The tailored domain concept as a mechanism for selectively enhancing or suppressing certain vibration modes was verified in one illustrative case by comparing the performance of a thin rectangular bar of gadolinium molybdate which first possessed a single domain and then was modified to contain a pair of symmetrical domains oppositely poled. The length of the bar was parallel to the orthorhombic [110] direction. Its dimensions along [110], [110] and [001] were approximately 13 × 2 × 1 mm. The crystal was poled to a single-domain state, the (001) faces were fully electroded and the resonant frequency spectrum measured from 10 kHz to 5 Mhz. The results are plotted in FIG. 7. The prominent peak at 140 kHz is the fundamental extensional mode along the length of the bar. This mode is driven by the piezoelectric coefficient, $d_{333}$, which excites a thickness vibration along [001]. The thickness vibration is coupled through Poisson's ratio to expansion and contractions in the [110] direction. Third, fifth and seventh harmonics of the length extension, as will be seen, are also present, but evenorder harmonics are absent as expected.

One half of the crystal bar was then poled in the opposite direction by an appropriate electrical driving force resulting in a two-domain bar, with each domain occupying half of the material. The frequency spectrum was again measured utilizing electrodes which again covered the full c-face as employed in the first measurement. From an examination of FIG. 7, it will be seen that second and sixth order harmonics of the length extension mode are present as prominent resonances while the fundamental and odd harmonics are greatly attenuated. Thus, the resonant frequencies are effectively doubled in the two-domain bar.

Striped domain patterns can also be formed in barium titanate germanate, $BaTiGe_2O_8$, a somewhat different type of piezoelectric. This compound has a structure which is an orthorhombic derivative of the tetragonal fresnoite, $Ba_2TiSi_2O_8$. The AIZU symbol is 4mmF2mm. Domains in this material are optically distinct because of the difference in birefringence between the 90° orientation states. Thus, the tailored domain patterns are visible in polarized light using a quarter-wave plate.

The piezoelectric matices for point groups 4mm and 2mm are very similar. In both cases there are five non-zero piezoelectric moduli: $d_{311}$, $d_{322}$, $d_{233}$ and $d_{131}$. No moduli disappear at the orthorhombic-tetragonal phase transition, as so often happens when the point group changes. In the 4mm → 2mm transition, the number of independent piezoelectric constants increases rather than the total number. Coefficients $d_{131}$ and $d_{223}$ which are identical in magnitude in the tetragonal phase, are no longer equal in the orthorhombic derivative. The same is true of $d_{311}$ and $d_{322}$, but $d_{131}$ and $d_{223}$ are more important because they are very large piezoelectric coefficients with electromechanical coupling factors near 0.3. Tailored domain structures in fresnoite-like materials are therefore useful in thickness-shear mode vibrations.

Lithium niobate and lithium tantalate are important piezoelectric materials used in high-frequency applications because of their low-loss characteristics. The crystals are generally poled to single-domain states at temperatures near the Curie point. Domains in $LiNbO_3$ are of the 180° type in which sign of the spontaneous polarization along the c-axis is reversed. This corresponds to mirror reflection of $X_3$ with $X_1$ and $X_2$ unchanged. Of the four independent piezoelectric coefficients in $LiNbO_3$, three change signs for the two domains. Coefficients $d_{15}$, $d_{31}$ and $d_{33}$ are reversed, whereas $d_{22}$ is not. Regarding elastic constants, all stiffness coefficients except $c_{14}$ are unchanged across twin walls. Therefore, selective mode excitation is possible for any vibration mode driven by $d_{15}$, $d_{31}$ and $d_{33}$. Acoustic waves will be unaffected by the walls provided the wave velocity is independent of $c_{14}$.

Figure 8:
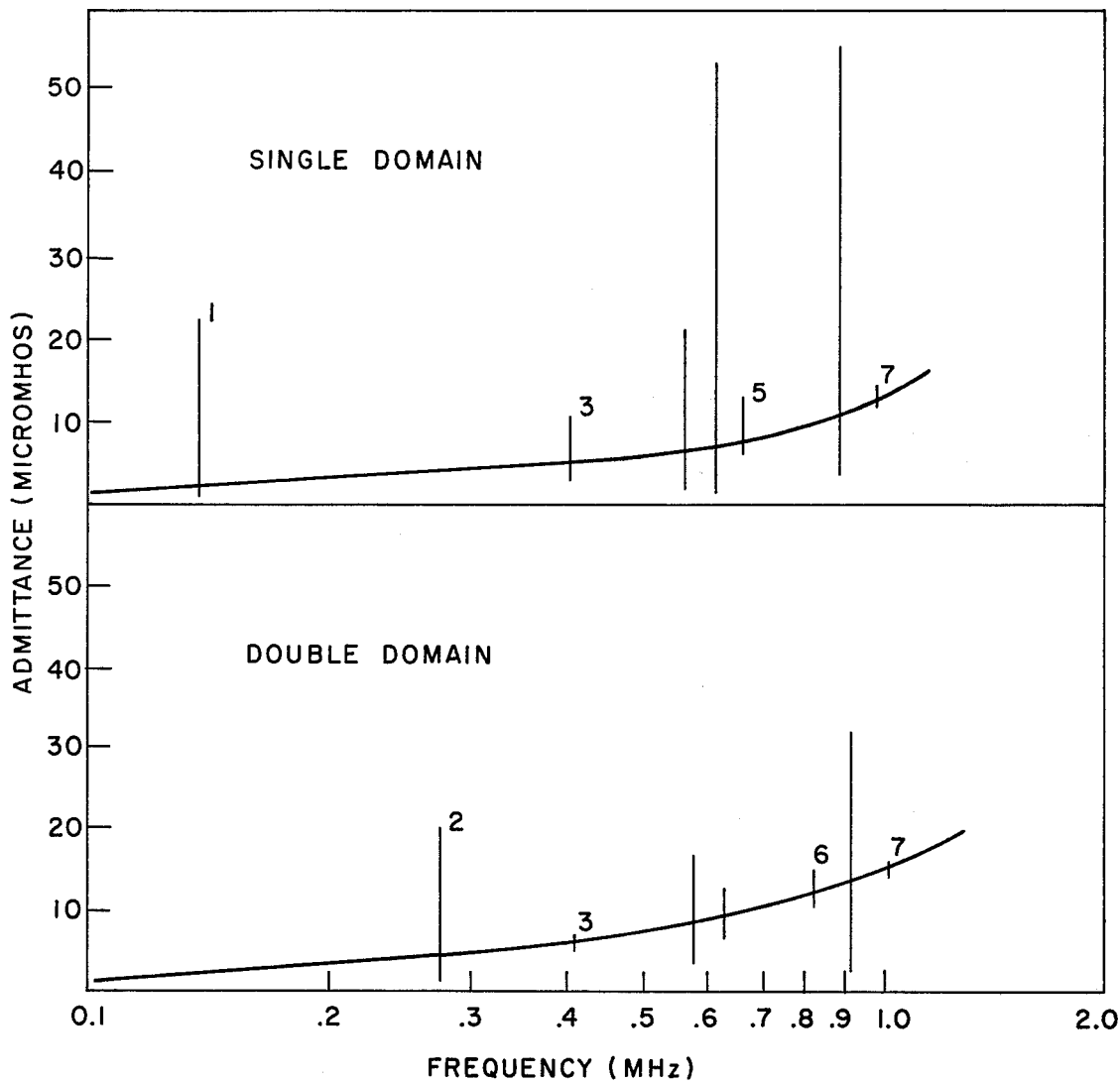
FIG. 8 illustrates an arrangement for writing domains wherein the crystal is part of a ferroelectric photoconductor sandwich structure.

Ferroelectric, ferroelastoelectric or ferrobielasticferroelastoelectric crystals can function as domain divided piezoelectric resonators. The desired domain structures may be "written" into these crystals in a variety of ways depending upon the crystal structure, the orientation of the cut and the type of domain pattern involved. Electrical writing can be employed for ferroelectric, ferroelastic-ferroelastoelectric crystals and ceramics. This method involves, for example, directly writing on the surface of a ferroelectric crystal with a high current electron beam. Very high resolution linear patterns can be generated in this way, such as a striped domain pattern in the ferroelectric $Bi_4Ti_3O_{12}$. Another way to accomplish this type of domain writing involves using an electrode pattern generated by photolithographic or similar techniques to define those areas of the crystal which are to be switched. This switching, it will be appreciated, is to be done initially to establish the desired domain pattern, and once accomplished, the material must be processed or the operating conditions selected so that subsequent domain switching does not take place. As a further electrical writing scheme, a ferroelectric photoconductor sandwich structure such as the one shown in FIG. 8 can be assembled consisting of, for example, a crystal of $Pb_5GE_3O_{11}$ having one face thereof covered with an organic photoconductor with a light transparent film of tin oxide superimposed thereon. The opposing face of the crystal is covered with a similar oxide layer. Both layers serve as electrodes for a direct current voltage source. The crystal is first poled to a single domain state by exposing the complete photoconductor area to an appropriate light source. In this way, the electric field is rendered effective and aligns all of the domains in a common direction. Thereafter the light source is turned off. To write in the particular domain pattern desired, the surface of the transparent electrode need only now be covered with an appropriate mask having opaque areas corresponding to those domains which are to remain poled in the above direction and complementary transparent areas defining those that are to be switched. With the mask in place and the polarity of the external electric field reversed, the light source need only be again turned on to complete the process. Instead of masking the transparent electrode, a suitable image can be created on this surface for defining those areas that are to be switched. The best resolution attainable with this process is approximately 50 lines per mm.

Domains can be formed in ferroelectric-ferroelastic-ferrobielastic crystals by thermal writing. For example, strong temperature gradients can be created within the material by using an infra-red laser. This requires masking the surface with a protective material except for the pattern to be switched and scanning the laser over this surface. Alternatively, a laser wavelength which is not absorbed by the crystal may be utilized with a printed pattern of absorption material. On the surface, use can be made of the photo-ferroelectric effect to generate large depolarization fields which backswitch locally illuminated regions. Also, a metal conductor can be arranged on the surface in accordance with the domain pattern and irradiated with an electron beam. Local heating by the conductor produces the domain switching.

Elastic writing can be used with ferroelastic-ferroelectric and ferrobielastic-ferroelastoelectric. This involves using a suitable constrained crystal so that local elastic stress fields may be generated by compressing, bending or twisting the crystal. In the case of pure ferroelastoelectric crystals, a combination of elastoelectric or electro-thermal methods may be employed to switch the piezoelectric domain structure.

One of the possible limitations to the utilization of the tailored domain concept of the present invention is that the domains arranged within the material switch may shift or experience changes in their properties and dimensions when the material is driven at high power levels. For example, in many ferroelectric crystals, domain switching may take place. However, this behavior is not common to all ferroic crystals. Quartz is ferrobielastic but not ferroelectric. Consequently, any domains formed within this material cannot be switched or altered by electrical fields. This is also the case with certain primary ferroics such as lithium niobate and other frozen ferroelectrics with high Curie points. In ferroelectrics with low coercive fields, the domain structure can often be fixed by irradiation with neutrons or gamma rays. Radiation damage serves to anchor the walls of the domain in a fixed position without appreciably lowering a mechanical Q of the material.

We claim:

1. In a method for preparing a ferroelectric element having a preselected domain pattern, the steps of
   applying an electrode to one face of said element;
   applying a photoconductive layer to an opposite face of said element;
   superimposing a light transparent electrode over said photoconducting layer;
   illuminating said transparent electrode with light energy while maintaining a DC voltage of one polarity across said electrodes thereby to align all of the domains in said element in a common direction;
   masking selected areas of said transparent electrode with a light blocking material; and
   illuminating said masked transparent electrode with light energy while maintaining a DC bias voltage of an opposite polarity across said electrodes, whereby those portions of the ferroelectric element which are beneath the unmasked portions of said photoconductive layer have domains which are anti-parallel to said common direction.

* * * * *